(12) United States Patent
Kim

(10) Patent No.: US 7,632,732 B2
(45) Date of Patent: Dec. 15, 2009

(54) METHOD OF MANUFACTURING MOS TRANSISTOR

(75) Inventor: Bong-Kil Kim, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/344,551

(22) Filed: Dec. 28, 2008

(65) Prior Publication Data

US 2009/0170257 A1 Jul. 2, 2009

(30) Foreign Application Priority Data

Dec. 31, 2007 (KR) .................. 10-2007-0141354

(51) Int. Cl.
*H01L 21/8238* (2006.01)
(52) U.S. Cl. ................ 438/217; 438/227; 257/E27.062
(58) Field of Classification Search ................ 438/217, 438/225–231
See application file for complete search history.

(56) References Cited

U.S. PATENT DOCUMENTS 5,382,820 A * 1/1995 Yang et al. .................. 257/371
5,618,743 A * 4/1997 Williams et al. ............ 438/276
6,900,101 B2 * 5/2005 Lin ............................ 438/276
2004/0171258 A1 9/2004 Park
2008/0057637 A1 * 3/2008 Choi ........................... 438/199

FOREIGN PATENT DOCUMENTS

KR 10-2000-0061623 10/2000
KR 10-2004-0077025 9/2004

* cited by examiner

*Primary Examiner*—Richard A. Booth
(74) *Attorney, Agent, or Firm*—Sherr & Vaughn, PLLC

(57) ABSTRACT

A method of manufacturing a transistor may include: forming a first well over a silicon substrate; forming a first mask pattern over the silicon substrate and using the formed first mask pattern to form a second well; removing the first mask pattern; forming a second mask pattern over the silicon substrate and using the formed second mask pattern to form a first drift region; removing the second mask pattern; forming a third mask pattern and using the formed third mask pattern to form a second drift region; removing the third mask pattern; forming a field oxide film over the silicon substrate; and introducing first conductive impurity ions into an upper surface of the silicon substrate by channel ion implantation.

20 Claims, 5 Drawing Sheets

METHOD OF MANUFACTURING MOS TRANSISTOR

The present application claims priority under 35 U.S.C. §119 to Korean Patent Application No. 10-2007-0141354 (filed on Dec. 31, 2007), which is hereby incorporated by reference in its entirety.

BACKGROUND

A high power MOS Field Effect Transistor (MOSFET), which is a unipolar device, may have relatively high input impedance compared to a bipolar transistor, so that it can have a great power gain and simple gate driver ICs. The high power MOSFET also has an advantage of no substantial time delay due to minority carrier accumulation and/or recombination when the device is turned-off. Accordingly, use of such a MOSFET has recently increased in various applications including, for example, production of a switching mode power supply, (open) lamp regulation, production of a motor driver IC, etc. Such a power MOSFET may include, for example, a double diffused MOSFET (DMOSFET) structure which uses a planar diffusion technique. Among high voltage semiconductor devices, a lateral diffusion MOS (LDMOS) having a specific structure suitable for high voltage applications, in which a channel region and a drain electrode are separated from each other by interposing a drift region therebetween and are controlled by a gate electrode, is an example of a DMOSFET.

Figure 1:
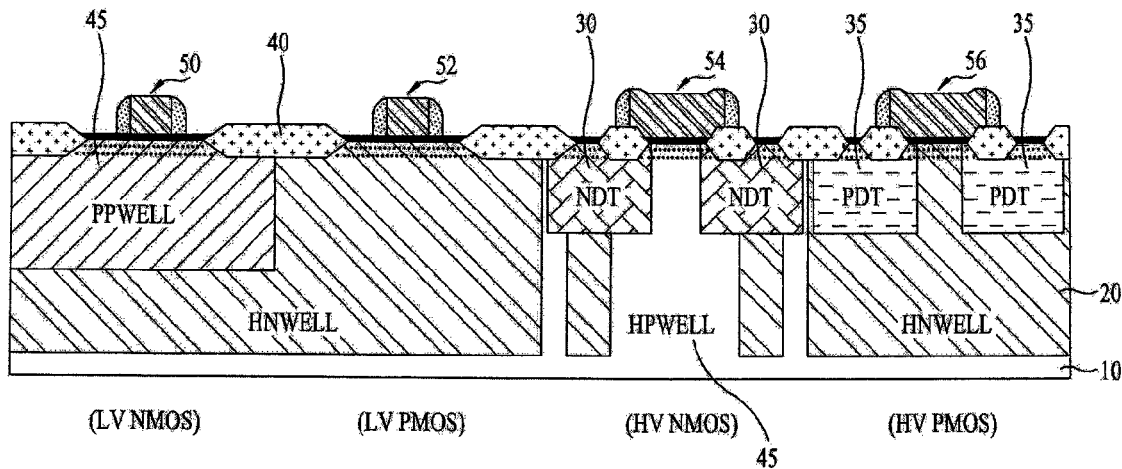

FIG. 1 is a cross-sectional view illustrating each transistor of a low voltage (LV) MOS gate driver and a high voltage (HV) MOS gate driver. Referring to FIG. 1, the gate driver may include LV PMOS, LV NMOS, HV NMOS and/or HV PMOS. In manufacturing such a gate driver, a channel ion implantation for targeting threshold voltages of HV NMOS and HV PMOS transistors needs an ion implantation mask so as to separately control the above HV NMOS and HV PMOS transistors, thereby causing an increase in production costs of the gate driver.

SUMMARY

Embodiments relate to a method for manufacturing a transistor in a simplified process achieved by omitting a step of forming a doping mask for controlling threshold voltage of an LDMOS transistor as an HV transistor, thus reducing production costs thereof.

In accordance with embodiments, a method of manufacturing a transistor may include at least one of the following: forming a first well on and/or over a silicon substrate; forming a first mask pattern on and/or over the silicon substrate and then using the formed first mask pattern to form a second well; removing the first mask pattern; forming a second mask pattern on and/or over the silicon substrate and then using the formed second mask pattern to generate a first drift region; removing the second mask pattern; forming a third mask pattern and then using the formed third mask pattern to generate a second drift region; removing the third mask pattern; forming a field oxide film on and/or over the silicon substrate; and introducing first conductive impurity ions into an upper surface of the silicon substrate by channel ion implantation.

In accordance with embodiments, a method may include at least one of the following: forming a first well in a silicon substrate; and then forming a first mask pattern over the silicon substrate; and then forming a second well in the silicon substrate using the first mask pattern as a mask; and then removing the first mask pattern; and then forming a second mask pattern over the silicon substrate; and then forming a first drift region in the silicon substrate using the second mask pattern as a mask; and then removing the second mask pattern; and then forming a third mask pattern over the silicon substrate; and then forming a second drift region in the silicon substrate using the third mask pattern as a mask; and then removing the third mask pattern; and then forming a field oxide film over the silicon substrate; and then introducing first conductive impurity ions into an upper surface of the silicon substrate by performing a channel ion implantation process.

In accordance with embodiments, a method may include at least one of the following: forming a first insulating layer over a silicon substrate; and then forming a first well in the silicon substrate by performing a first ion implantation process; and then forming a second layer over the first insulating layer; and then forming a first mask pattern over the second insulating layer; and then forming a second well in the silicon substrate by performing a second ion implantation process using the first mask pattern as a mask; and then removing the first mask pattern; and then removing the first insulating layer and the second insulating layer; and then forming a third insulating layer over the silicon substrate; and then forming a second mask pattern over the third insulating layer; and then forming a first drift region in the second well by performing a third implantation process using the second mask pattern as a mask; and then removing the second mask pattern; and then forming a third mask pattern over the silicon substrate; and then forming a second drift region in the first well by performing a fourth implantation process using the third mask pattern as a mask; and then removing the third mask pattern; and then activating the first and second drift regions by performing an annealing process; and then sequentially forming fourth and fifth insulating layers over the silicon substrate; and then implanting first conductive impurity ions into an upper surface of the silicon substrate by performing a channel ion implantation process.

In accordance with embodiments, a method of manufacturing a high voltage transistor such as an LDMOS transistor may omit a step of forming a channel ion implantation mask for control of threshold voltage of the LDMOS transistor via counter doping, thereby simplifying production processes and reducing production costs thereof.

DRAWINGS

FIG. 1 is a cross-sectional view illustrating a conventional LDMOS transistor; and Example FIGS. 2A to 2H illustrate a method of manufacturing an LDMOS transistor in accordance with embodiments.

DESCRIPTION

Figure 2A:
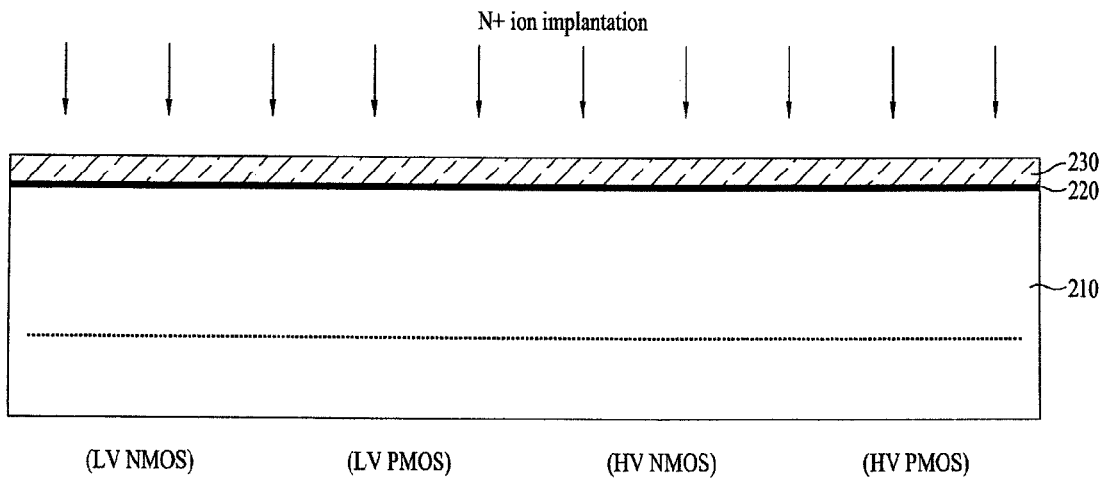

As illustrated in example FIG. 2A, after first oxide layer 220 is deposited on and/or over silicon substrate 210, N type impurity ions such as phosphorus ions are implanted into an upper surface of silicon substrate 210. Nitride layer 230 is then deposited on and/or over first oxide layer 220.

Figure 2B:
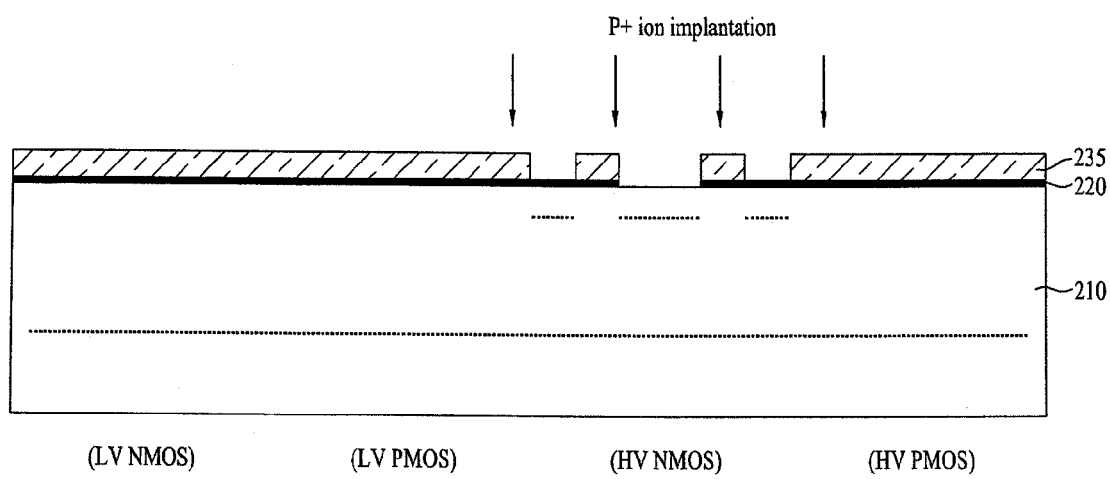

As illustrated in example FIG. 2B, a first mask pattern is then formed on and/or over silicon substrate 210 including nitride layer 230. Using the first mask pattern, nitride layer 230 is selectively etched to form nitride layer pattern 235. The first mask pattern may be formed so that a P type well is selectively formed in silicon substrate 210, and may be removed after nitride layer pattern 235 is formed. Using nitride layer pattern 235 as an ion implantation mask, P type impurity ions such as boron ions are then selectively implanted into silicon substrate 210. The first mask pattern may be directly formed on and/or over first oxide layer 220 without deposition of nitride layer 230 thereon, followed by using the formed first mask pattern as an ion implantation mask to selectively implant P type impurity ions into silicon substrate 210. After the ion implantation, the first mask pattern is removed.

Figure 2C:
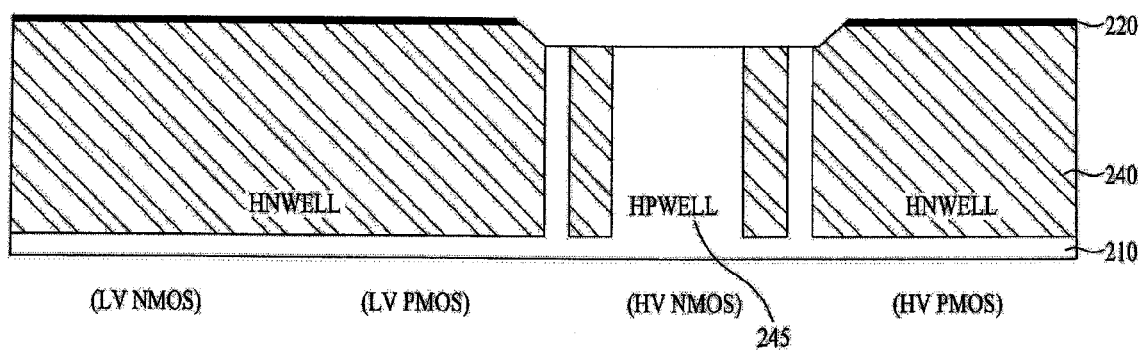

As illustrated in example FIG. 2C, N type well 240 and P type well 245 may be formed in silicon substrate 210 by a drive-in process. N type well 240 is a region on and/or over which an HV PMOS is formed. Likewise, P type well 245 is another region on and/or over which an HV NMOS is formed. Following this, wet etching is performed to remove nitride layer 235.

Figure 2D:
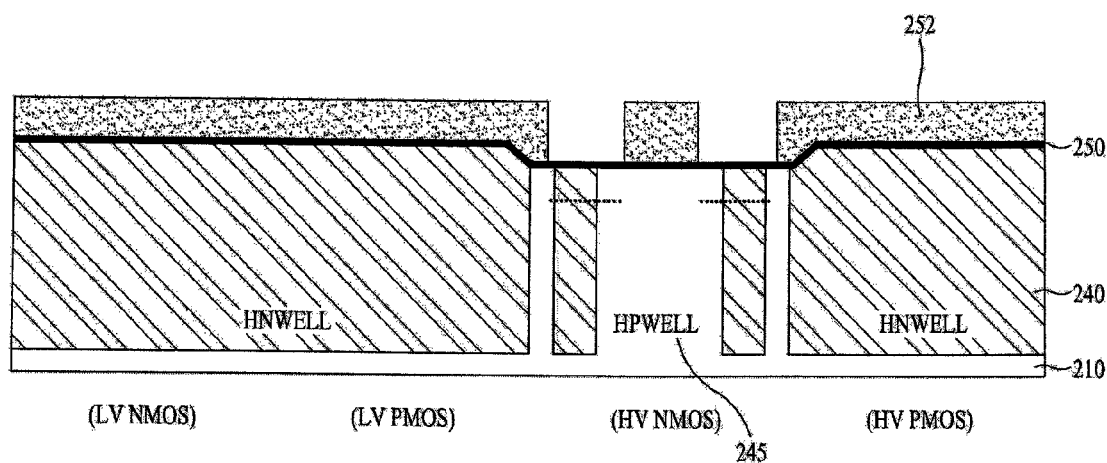

As illustrated in example FIG. 2D, after removing first oxide layer 220, second oxide layer 250 is deposited on and/or over silicon substrate 210. Second mask pattern 252 is then formed on and/or over second oxide layer 250. Second mask pattern 252 is then used as an ion implantation mask to selectively implant first conductive impurity ions such as phosphorus ions into silicon substrate 210, thus forming first drift region 260. After the ion implantation, second mask pattern 252 is removed. In other words, second mask pattern 252 may be formed so that first drift region, i.e., N drift region 260, is generated in P type well 245.

Figure 2E:
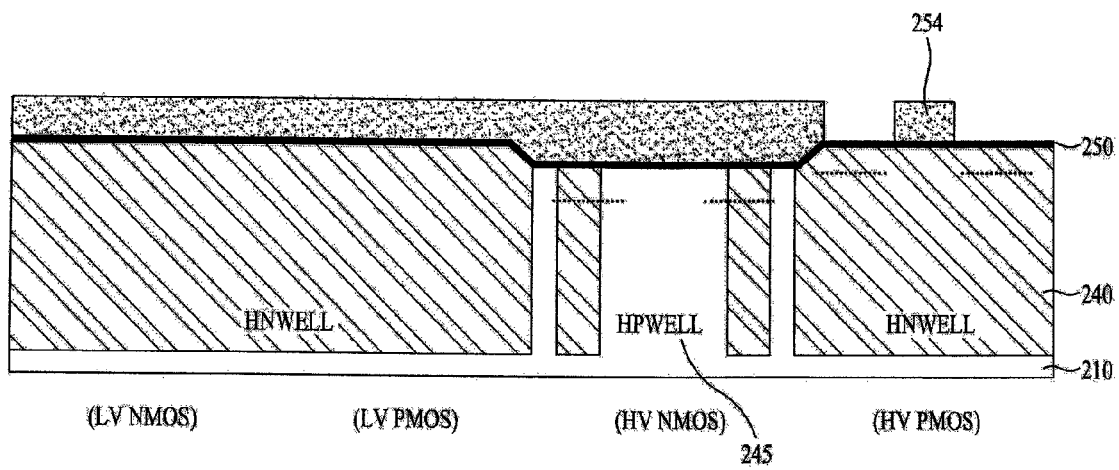

As illustrated in example FIG. 2E, third mask pattern 254 is formed on and/or over silicon substrate 210. Third mask pattern 254 is then used as an ion implantation mask to selectively implant second conductive impurity ions such as boron ions into the silicon substrate 210, thus forming second drift region 270. After the ion implantation, third mask pattern 254 is removed. Third mask pattern 254 may be formed so that the second drift region, i.e., P drift region 270, is generated in N type well 240. N drift region 260 and P drift region 270 are then subjected to an annealing process so as to activate both regions.

Figure 2F:
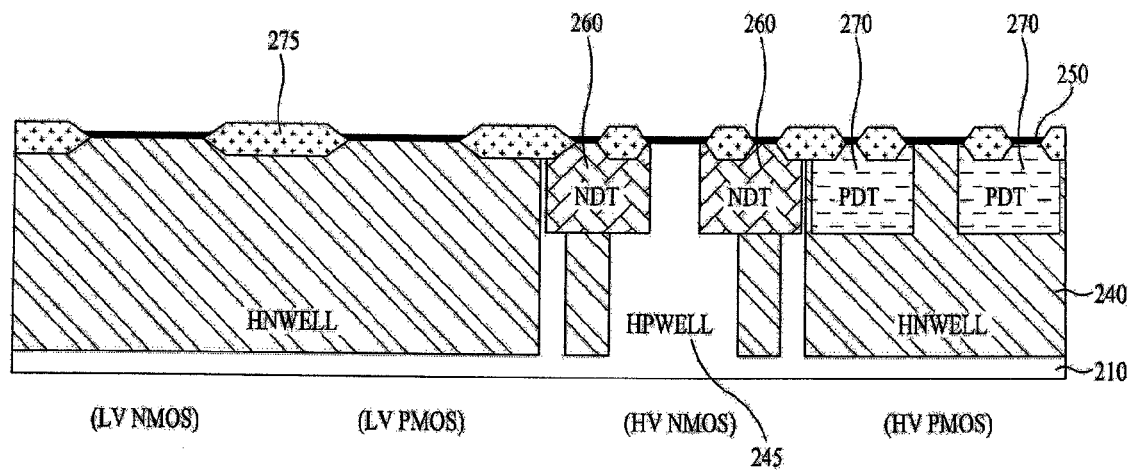
Figure 2G:
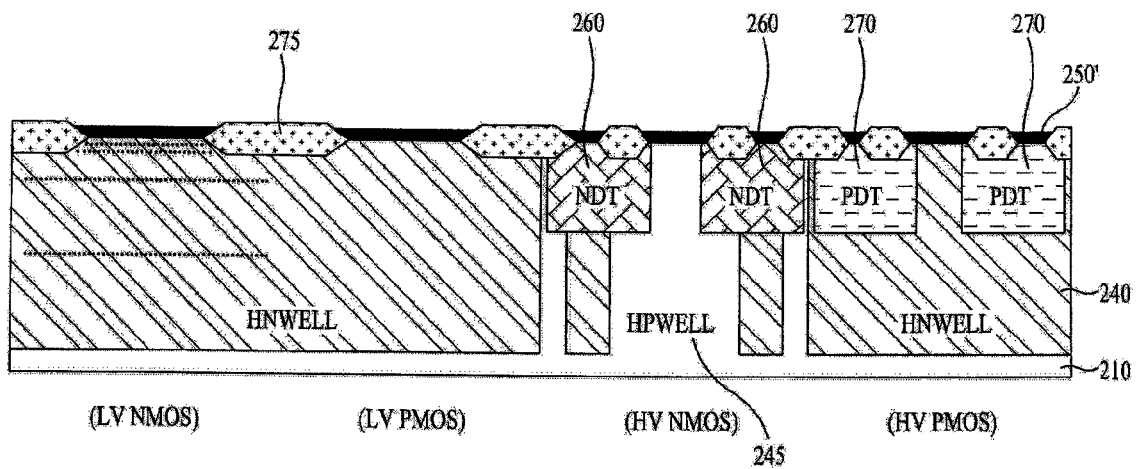

As illustrated in example FIG. 2F, field oxide film 275 is then selectively formed on and/or over silicon substrate 210. Field oxide film 275 may be formed in consideration of gates for HV PMOS and HV NMOS transistors to be given to silicon substrate 210. Field oxide film 275 may have a deposition thickness in a range between approximately 5,500 to 6,500 Å. As illustrated in example FIG. 2G, third oxide layer 250' is then deposited on and/or over silicon substrate 210 including field oxide film 275.

Figure 2H:
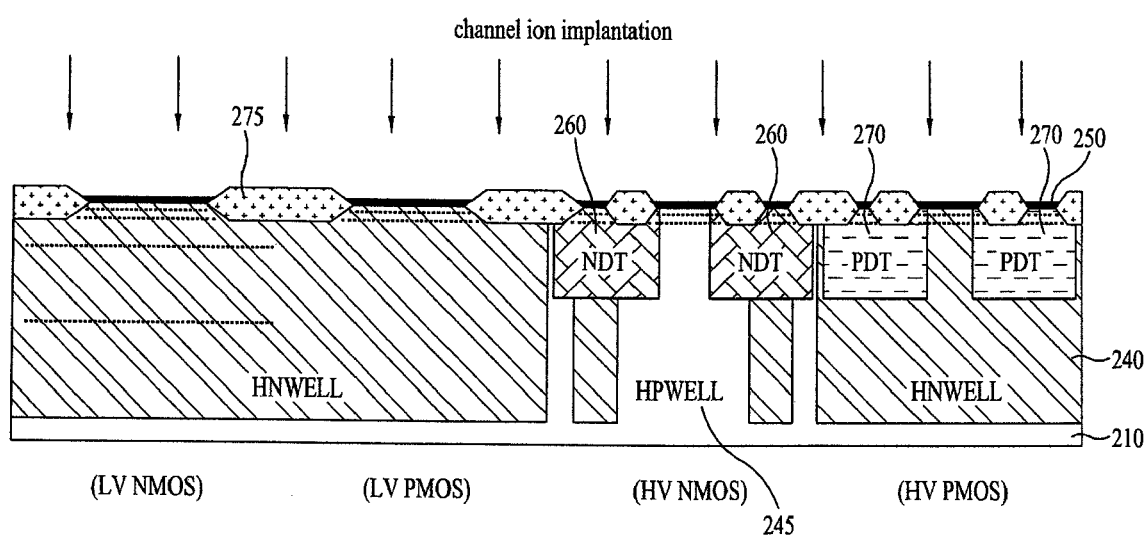

As illustrated in example FIG. 2H, channel ions are then implanted into the upper surface of silicon substrate 210 on and/or over which third oxide layer 250' was deposited. Such a channel ion implantation may be performed into the upper surface of silicon substrate 210 so that threshold voltages of HV PMOS and HV NMOS transistors can be controlled. The channel ion implantation may allow an HV N channel to be counter doped while forming a buried channel in an HV P channel. Since the N type well of the HV PMOS transistor is counter doped, the threshold voltage of the same transistor may be controlled. On the other hand, the threshold voltage of the HV NMOS transistor may be controlled because the P type well has the buried channel formed therein. Consequently, each threshold voltage of the HV PMOS and the HV NMOS transistors is preferably controlled by channel ion implantation into the upper surface of the silicon substrate simultaneously, even without using any channel ion implantation mask.

The threshold voltage may be controlled by counter doping resulting from the channel ion implantation into the upper surface of the silicon 210 and/or the buried channel effect, on the basis of ion implanting dose for the N type well 240 and/or the P type well 245, drive-in temperature, temperature for forming the field oxide film 275 and so forth. Therefore, although an ion implantation mask is typically required for channel ion implantation to control threshold voltage of both an HV NMOS (HVN) and an HV PMOS (HVP), a method for manufacturing an LDMOS transistor in accordance with embodiments may implant channel ions into the upper surface of the silicon substrate without using any ion implantation mask, as shown in example FIG. 2H, thus simplifying the channel ion implantation process. As a result, the present inventive method may reduce time for manufacturing the LDMOS transistor, thereby maximizing production capacity thereof.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a first well in a silicon substrate; and then
   forming a first mask pattern over the silicon substrate; and then
   forming a second well in the silicon substrate using the first mask pattern as a mask; and then
   removing the first mask pattern; and then
   forming a second mask pattern over the silicon substrate; and then
   forming a first drift region in the silicon substrate using the second mask pattern as a mask; and then
   removing the second mask pattern; and then
   forming a third mask pattern over the silicon substrate; and then
   forming a second drift region in the silicon substrate using the third mask pattern as a mask; and then
   removing the third mask pattern; and then
   forming a field oxide film over the silicon substrate; and then
   introducing first conductive impurity ions into an upper surface of the silicon substrate by performing a channel ion implantation process.

2. The method of claim 1, wherein the first well comprises an N-type well.

3. The method of claim 2, wherein the second well comprises a P-type well.

4. The method of claim 3, wherein the first drift region comprises an N drift region.

5. The method of claim 4, wherein the second drift region comprises a P drift region.

6. The method of claim 1, wherein forming the first well comprises implanting N-type impurity ions into the silicon substrate.

7. The method of claim 6, wherein forming the second well comprises implanting P-type impurity ions into the silicon substrate.

8. The method of claim 7, wherein forming the first drift region comprises implanting N-type impurity ions into the second well.

9. The method of claim 8, wherein forming the second drift region comprises implanting P type impurity ions into the first well.

10. The method of claim 1, wherein performing the channel ion implantation process comprises implanting P-type impurity ions into the upper surface of the silicon substrate.

11. The method of claim 10, wherein the P-type impurity ions are simultaneously counter doped in the first well.

12. The method of claim 10, wherein implanting P-type impurity ions into the upper surface of the silicon substrate comprises forming a buried channel in the second well.

13. The method of claim 1, further comprising, before forming the first well: forming an oxide layer over the silicon substrate.

14. The method of claim 1, further comprising, after forming the field oxide film, forming an oxide layer over the silicon substrate including the field oxide film.

15. The method of claim 1, wherein the field oxide film has a deposition thickness in a range between approximately 5,500 to 6,500 Å.

16. A method comprising:
 forming a first insulating layer over a silicon substrate; and then
 forming a first well in the silicon substrate by performing a first ion implantation process; and then
 forming a second layer over the first insulating layer; and then
 forming a first mask pattern over the second insulating layer; and then
 forming a second well in the silicon substrate by performing a second ion implantation process using the first mask pattern as a mask; and then
 removing the first mask pattern; and then
 removing the first insulating layer and the second insulating layer; and then
 forming a third insulating layer over the silicon substrate; and then
 forming a second mask pattern over the third insulating layer; and then
 forming a first drift region in the second well by performing a third implantation process using the second mask pattern as a mask; and then
 removing the second mask pattern; and then
 forming a third mask pattern over the silicon substrate; and then
 forming a second drift region in the first well by performing a fourth implantation process using the third mask pattern as a mask; and then
 removing the third mask pattern; and then
 activating the first and second drift regions by performing an annealing process; and then
 sequentially forming fourth and fifth insulating layers over the silicon substrate; and then
 implanting first conductive impurity ions into an upper surface of the silicon substrate by performing a channel ion implantation process.

17. The method of claim 16, wherein the first, third, fourth and fifth insulating layers comprise an oxide layer and the second insulating layer comprises a nitride layer.

18. The method of claim 16, wherein the fourth insulating layer comprises a field oxide layer.

19. The method of claim 16, wherein the first well comprises an N-type well, the second well comprises a P-type well, the first drift region comprises an N drift region and the second drift region comprises a P drift region.

20. The method of claim 16, wherein performing the channel ion implantation process comprises implanting P-type impurity ions into the upper surface of the silicon substrate, wherein the P-type impurity ions are simultaneously counter doped into the first well.

* * * * *